United States Patent

Nam et al.

[11] Patent Number: 5,825,469
[45] Date of Patent: Oct. 20, 1998

[54] AUTO FOCUS SYSTEM USING TWICE REFLECTION

[75] Inventors: Byung-Ho Nam, Kyungsangbook-Do; Jae-Keun Jeong, Choongcheongbuk-Do, both of Rep. of Korea

[73] Assignee: LG Semicon Co., Ltd., Choongcheongbuk-Do, Rep. of Korea

[21] Appl. No.: 953,410

[22] Filed: Oct. 17, 1997

[30] Foreign Application Priority Data

Oct. 28, 1996 [KR] Rep. of Korea ............... 49030/1996

[51] Int. Cl.⁶ ............................ G03B 27/34; G03B 27/42
[52] U.S. Cl. ............................ 355/55; 355/53; 250/548; 250/559.29
[58] Field of Search ............................ 355/53, 55, 57, 355/60, 61, 71; 250/201.4, 201.6, 548, 559.29, 559.31; 356/399, 400, 401

[56] References Cited

U.S. PATENT DOCUMENTS

| | | | |
|---|---|---|---|
| 5,489,966 | 2/1996 | Kawashima et al. | 355/53 |
| 5,684,569 | 11/1997 | Sugaya et al. | 355/53 |
| 5,710,620 | 1/1998 | Taniguchi | 355/53 |
| 5,760,879 | 6/1998 | Shinonaga et al. | 355/55 |

*Primary Examiner*—A. A. Mathews
*Attorney, Agent, or Firm*—Morgan, Lewis & Bockius LLP

[57] ABSTRACT

An auto focus system incudes a light source; a beam splitting means for transmitting a first beam emitted from the light source and reflecting a second beam emitted from the light source; a reflective mirror for reflecting the first beam from the beam splitting means; a wafer mounted on a wafer stage for receiving and reflecting the first beam reflected by the reflective mirror; a total reflection means for reversing a direction of the first beam from the wafer; a detector for detecting the first beam after the first beam is reflected from the total reflection means, the wafer, the reflective mirror, and the beam splitter, and for converting the first beam into an electrical signal; and a control unit for controlling the wafer stage in accordance with the electrical signal generated from the detector.

10 Claims, 2 Drawing Sheets

AUTO FOCUS SYSTEM USING TWICE REFLECTION

This application claims the benefit of Korean Application No. 49030/1996 filed on Oct. 28, 1996, which is hereby incorporated by reference.

BACKGROUND OF THE INVENTION

1. Field of the Invention

The present invention relates to an auto focus system, and more particularly, to an auto focus system with enhanced focus precision capability.

2. Description of the Related Art

FIG. 1 is a schematic view showing an auto focus system of a conventional light exposing apparatus. As shown in FIG. 1, the auto focus system includes a wafer (w) mounted on a wafer stage 4 which is movable in the horizontal and vertical directions. A light source 1 emits a laser beam from an upper direction of the wafer stage 4. A first reflective mirror 2 reflects a light from the light source 1. A first condensing lens 3 condenses the reflected light from the first reflective mirror 2. A second condensing lens 5 condenses the light again when the light is reflected from the surface of the wafer (w). A second reflective mirror 6 reflects the condensed light, and a CCD (charge-coupled device) detector 7 then receives the reflected light. A control unit 9 has one side electrically connected to the CCD detector 7 and the other side electrically connected to the wafer stage 4.

Reference numeral 8 represents a reduction projection lens for reducing and projecting a light such as an ultraviolet light at a predetermined magnification. As a result, a desired pattern is formed on the wafer (w) after focusing the wafer (w) mounted on the wafer stage 4 through the auto focus system of the light exposing apparatus according to the conventional art.

The operation of the conventional auto focus system will now be described. A helium-neon laser beam is emitted from the light source 1, reflected by the reflective mirror 2, and condensed by the condensing lens 3. The condensed beam is then reflected on the surface of the wafer (w) mounted on the wafer stage 4. Then, the reflected beam is condensed by the condensing lens 5, and reflected on the reflective mirror 6, and finally enters the CCD detector 7. The CCD detector 7 converts the detected beam into an electric current. The electric current then passes through an electrical circuit (not illustrated) to be changed to a voltage. The values of the converted voltage signal correspond to particular positions of the wafer stage 4, e.g., coordinate values, through an analog/digital converter (A/D) (not illustrated).

The control unit 9 compares the coordinate value obtained from the detector 7 with a standard value, e.g., a predetermined coordinate value, and feeds back to the wafer state 4 a signal generated by the control unit 9 as a result of the comparison. In accordance with the above operation, the position of the wafer stage 4 is automatically adjusted vertically.

If the wafer stage 4 is moved downward $\Delta Z$, the position of the beam reflected on the surface of the wafer (w) accordingly changes by $\Delta X$, as compared to the beam reflected on the wafer (w) surface before the wafer stage 4 is moved, i.e., $$\Delta X = \Delta Z / \cos \theta \tag{1}$$

wherein, $\theta$ is an incident angle of a light with respect to the wafer.

According to the movement of the wafer stage 4, a location of a light spot detected from the CCD detector 7 is changed. A signal obtained by comparing the coordinate value after the wafer position change with the standard coordinate value is fed back to the wafer stage 4. Accordingly, the position of the wafer stage 4 is again automatically adjusted vertically.

The focusing procedure, by which the wafer stage is moved so that the wafer mounted on the wafer stage is located in a focus range of the reduction projection lens, requires a very high precision. Therefore, the change of the signal detected in the detector 7 in accordance with a minute movement of the wafer stage must be as large as possible.

However, in the conventional auto focus system of a light exposing apparatus, the signal changes detected from the CCD detector in accordance with the movement of the wafer stage are not large. This lowers the precision of the auto focusing system.

Further, since the helium-neon laser beam is used as a light source, the size of the system is inefficiently large.

SUMMARY OF THE INVENTION

Accordingly, the present invention is directed to an auto focus system that substantially obviates one or more of the problems due to limitations and disadvantages of the related art.

An object of the present invention is to provide an improved auto focus system with a small and convenient size by using a laser diode as a light source.

Another object of the present invention is to provide an improved auto focus system with enhanced focus precision by increasing the signal changes detected in accordance with the movement of the wafer stage.

Additional features and advantages of the invention will be set forth in the description which follows, and in part will be apparent from the description, or may be learned by practice of the invention. The objectives and other advantages of the invention will be realized and attained by the structure particularly pointed out of the written description and claims hereof as well as the appended drawings.

To achieve these and other advantages and in accordance with the purpose of the present invention, as embodied and broadly described, an improved auto focus system includes a light source, a beam splitter for transmitting a predetermined beam emitted from the light source and reflecting another predetermined beam, a reflective mirror for reflecting the beam which has transmitted the beam splitter, a wafer stage having the wafer mounted thereon for receiving and reflecting the beam reflected by the reflective mirror, a total reflection prism for reversing the proceeding direction of the beam reflected from the surface of the wafer, a detector for detecting the beam incident thereto after the beam reflected from the total reflection means is incident again to the wafer to be reflected on the reflective mirror and then to be reflected on the beam splitter and for converting it into an electrical signal, and a control unit for controlling the wafer stage in accordance with the signal detected from the detector.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
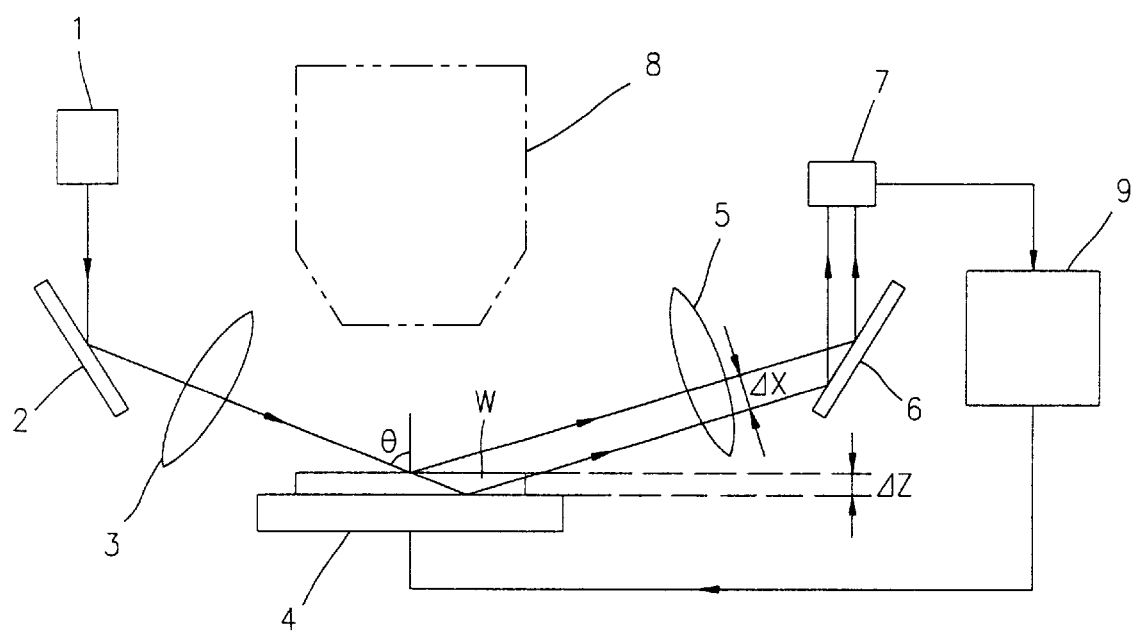
FIG. 1 is a schematic view showing a conventional auto focus system of a light exposing apparatus.
Figure 2:
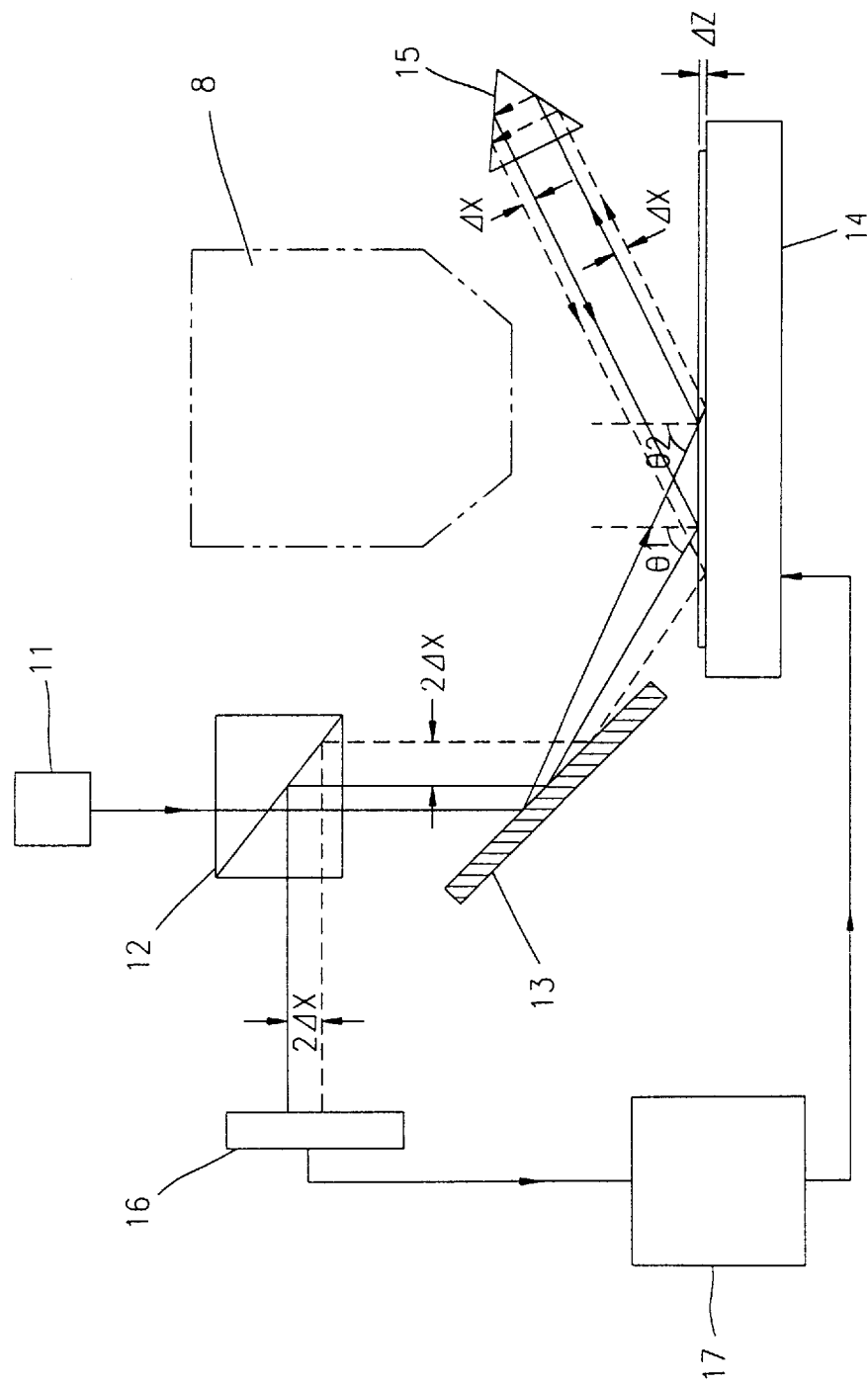
FIG. 2 is a schematic view showing an auto focus system according to the present invention.

With reference to FIG. 2, an auto focus system according to the present invention includes a wafer (w) mounted on a wafer stage 14 which is movable vertically. A light source 11 for emitting a laser beam with a waveform length around 670 cm is disposed at a predetermined upper portion of the wafer stage 14. A beam splitter 12 reflects a P wave and allows an S wave to pass through. A reflective mirror 13 reflects the S wave onto the surface of the wafer (w). A total reflection prism 15 reflects the reflected light from the wafer surface to reverse its direction so that the reflected beam is incident again to the wafer (w). A photo detector 16 detects a beam light from the total reflection prism 15, after it bounces off the wafer (w) surface and is reflected by the reflective mirror 13 and the beam splitter 12. A control unit 17 generates a control signal in accordance with a signal applied from the detector 16. The control unit 17 is electrically connected to the wafer stage 14.

A condensing lens (not illustrated) for condensing a light may be provided between the reflective mirror 13 and the wafer (w).

In the present invention, a laser diode may be used as the light source 11. Also, another apparatus, besides the photodetector, for converting a light signal into an electrical signal may be adopted.

The operation of the auto focus system according to the present invention will now be described.

A beam is emitted from the light source 11, and split into a P polarized beam and an S polarized beam in the beam splitter 12. Through the beam splitter 12, the P polarized beam is reflected and the S polarized beam is transmitted. Then, the S polarized beam is reflected by the reflective mirror 13 onto the wafer surface, and the reflected beam is incident to the total reflection prism 15. The course of the light is then reversed to be reflected again on the surface of the wafer (w). Then, the beam is reflected again by the reflective mirror 13 to be sent back to the beam splitter 12. The reflected beam is sent to the detector 16 so that the light signal is converted into an electrical signal. The converted electrical signal is applied to the control unit 17, and a control signal generated in accordance with the electrical signal is fed back to the wafer stage 14. Consequently, the position of the wafer stage 14 is moved vertically.

As the S polarized beams are primarily reflected on the wafer (w), and changed in direction by the total reflection prism 15 and then secondarily reflected by the wafer (w), the light path changes before and after the wafer stage 14 is moved. The light path of the S polarized beams changes by $\Delta X$ before and after the movement of the wafer stage 14 when the S polarized beams are primarily reflected. The light path of the S polarized beams changes by $2\Delta X$ before and after the movement of the wafer stage when the S polarized beams are secondarily reflected on the wafer surface. Since the beam position changes twice as much in comparison with the conventional system, a large signal is detected when there is a minute movement of the wafer stage.

In the above-described embodiment, since the S polarized beam is reflected on the surface of the wafer without passing through the wafer, the correct position of the wafer can be detected.

In addition, since the signal is twice as large as that in the conventional system in accordance with the movement of the wafer stage 14, the precision of the auto focus system is greatly improved.

Further, since a laser diode is used as a light source, the size of the auto focus system is reduced.

Moreover, since the signal detected by the two-time-reflection on the wafer surface has the characteristic of a horizontal signal automatically, the leveled degree of the wafer surface mounted on the wafer stage can be detected effectively.

Accordingly, the present invention provides an improved auto focus system which is capable of enhancing precision of focusing by twice-reflecting a beam emitted from a light source.

It will be apparent to those skilled in the art that various modifications and variations can be made in the auto focus system of the present invention without departing from the sprit or scope of the invention. Thus, it is intended that the present invention cover the modifications and variations of this invention provided they come within the scope of the appended claims and their equivalents.

What is claimed is:

1. An auto focus system comprising:
   a light source;
   a beam splitting means for transmitting a first beam emitted from the light source and reflecting a second beam emitted from the light source;
   a reflective mirror for reflecting the first beam from the beam splitting means;
   a wafer mounted on a wafer stage for receiving and reflecting the first beam reflected by the reflective mirror;
   a total reflection means for reversing a direction of the first beam reflected from the wafer;
   a detector for detecting the first beam after the first beam is reflected from the total reflection means, the wafer, the reflective mirror, and the beam splitter, and for converting the first beam into an electrical signal; and
   a control unit for controlling the wafer stage in accordance with the electrical signal generated from the detector.

2. The system of claim 1, wherein the detector includes a photodetector.

3. The system of claim 1, wherein the first beam is an S wave.

4. The system of claim 1, wherein the light source includes a laser diode.

5. The system of claim 1, wherein the total reflecting means includes a total reflection prism.

6. An auto focus system comprising;
- a light source for emitting a laser beam including a first beam and a second beam;
- a beam splitter for transmitting the first beam and reflecting the second beam;
- a reflective mirror for reflecting the first beam transmitted from the beam splitter;
- a wafer mounted on a wafer stage for reflecting the first beam from the reflective mirror;
- a total reflection prism for reversing a direction of the first beam;
- a detector for detecting the first beam after the first beam is reflected from the total reflection prism, the wafer, the reflective mirror, and the beam splitter, and for converting the first beam into a electric signal; and
- a control unit for varying a position of the wafer stage in accordance with the electric signal generated from the detector.

7. The system of claim 6, wherein the light source includes a laser diode.

8. The system of claim 6, wherein the first beam is a S polarized beam, and the second beam is a P polarized beam.

9. The system of claim 6, wherein the detector includes a photodetector.

10. The system of claim 6, further comprising a condensing lens between the reflective mirror and the wafer for condensing the first beam.

* * * * *